US009812215B2

(12) United States Patent
Takizawa et al.

(10) Patent No.: US 9,812,215 B2
(45) Date of Patent: Nov. 7, 2017

(54) MEMORY DEVICE THAT EXECUTES AN ERASE OPERATION FOR A NONVOLATILE MEMORY

(71) Applicant: Toshiba Memory Corporation, Minato-ku (JP)

(72) Inventors: Kazutaka Takizawa, Yokohama (JP); Chao Wang, Kamakura (JP); Masaaki Niijima, Machida (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/260,962

(22) Filed: Sep. 9, 2016

(65) Prior Publication Data

US 2017/0278581 A1    Sep. 28, 2017

Related U.S. Application Data

(60) Provisional application No. 62/313,325, filed on Mar. 25, 2016.

(51) Int. Cl.
*G11C 16/16* (2006.01)
*G11C 16/34* (2006.01)
*G11C 16/10* (2006.01)
*G11C 16/26* (2006.01)

(52) U.S. Cl.
CPC .......... *G11C 16/3495* (2013.01); *G11C 16/10* (2013.01); *G11C 16/16* (2013.01); *G11C 16/26* (2013.01); *G11C 16/3445* (2013.01)

(58) Field of Classification Search
CPC ....................................................... G11C 16/16
USPC ...................................................... 365/185.33
See application file for complete search history.

(56) References Cited

U.S. PATENT DOCUMENTS

| 6,377,491 | B2 * | 4/2002 | Otani ..................... G11C 16/16 365/185.11 |
| 7,242,615 | B2 * | 7/2007 | Nagashima ............ G11C 16/06 365/185.09 |
| 8,452,913 | B2 * | 5/2013 | Sudo ................... G06F 12/0246 711/100 |
| 8,966,343 | B2 | 2/2015 | Syu et al. |
| 9,153,331 | B2 | 10/2015 | D'Abreu et al. |
| 9,235,470 | B2 * | 1/2016 | Bhalerao ............ G06F 11/1068 |
| 2010/0107021 | A1 | 4/2010 | Nagadomi et al. |
| 2012/0113724 | A1 * | 5/2012 | Sako .................. G11C 16/0483 365/185.22 |

(Continued)

FOREIGN PATENT DOCUMENTS

| JP | 2009-87509 | 4/2009 |
| JP | 2011-203771 | 10/2011 |
| JP | 2012-27991 | 2/2012 |

*Primary Examiner* — Son Mai
(74) *Attorney, Agent, or Firm* — Oblon, McClelland, Maier & Neustadt, L.L.P.

(57) ABSTRACT

According to one embodiment, a memory device includes a controller, and a nonvolatile memory in which an erase operation is controlled by the controller, the nonvolatile memory including blocks, the erase operation executing every block, the nonvolatile memory transferring a first reply showing a completion of the erase operation and a fail bit count showing a number of memory cells in which a data erase is uncompleted after the completion of the erase operation to the controller. The controller selects a target block as a target of the erase operation based on the fail bit count.

20 Claims, 15 Drawing Sheets

(56) References Cited

U.S. PATENT DOCUMENTS

| | | | |
|---|---|---|---|
| 2014/0003147 A1* | 1/2014 | Dutta | G11C 11/5635 |
| | | | 365/185.11 |
| 2014/0310574 A1 | 10/2014 | Yu et al. | |
| 2015/0100851 A1* | 4/2015 | Bhalerao | G06F 11/1068 |
| | | | 714/773 |
| 2016/0163393 A1* | 6/2016 | Liang | G11C 16/349 |
| | | | 365/185.12 |

* cited by examiner

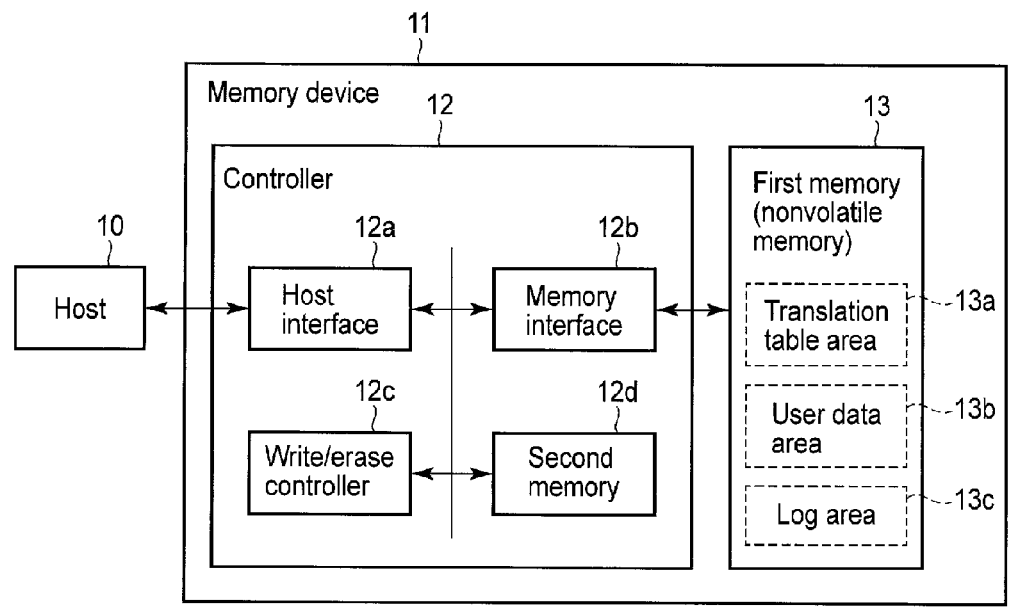
F I G. 1
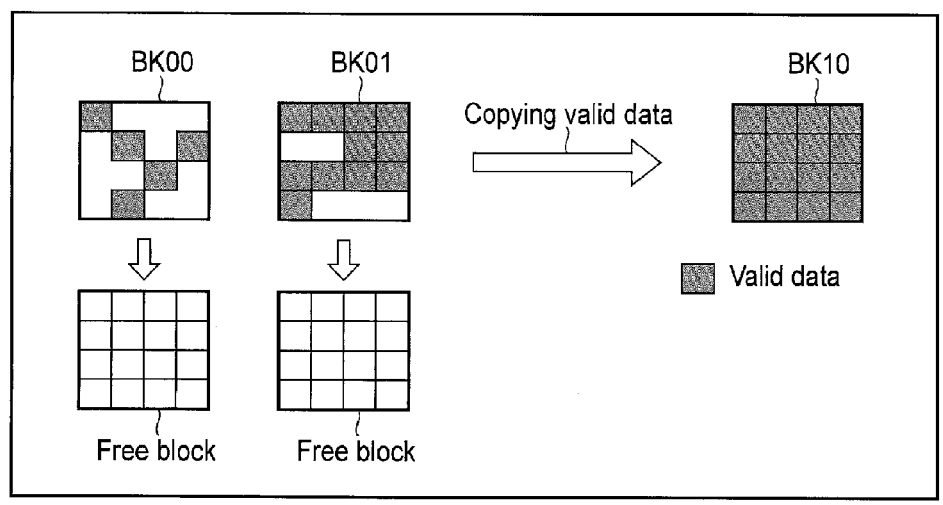
F I G. 5

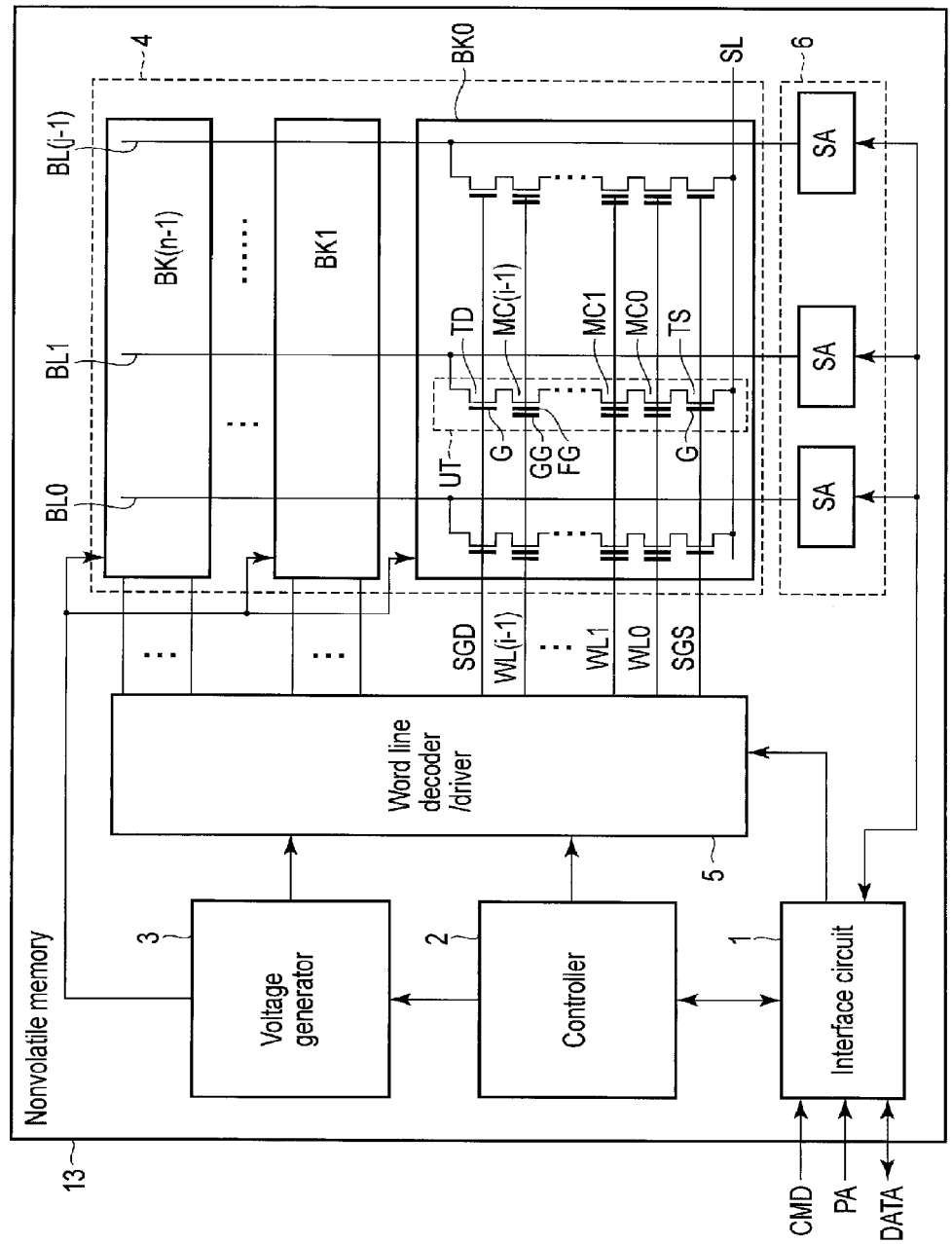
F I G. 2

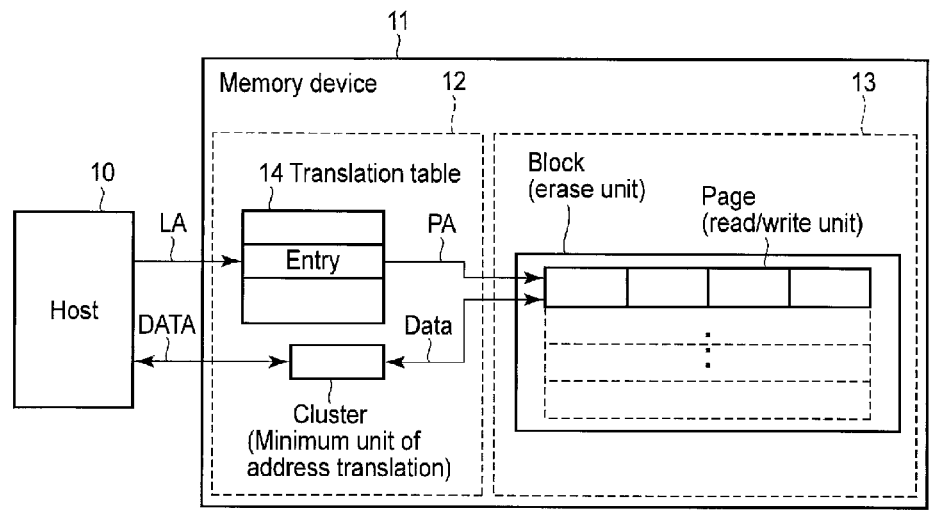
F I G. 3
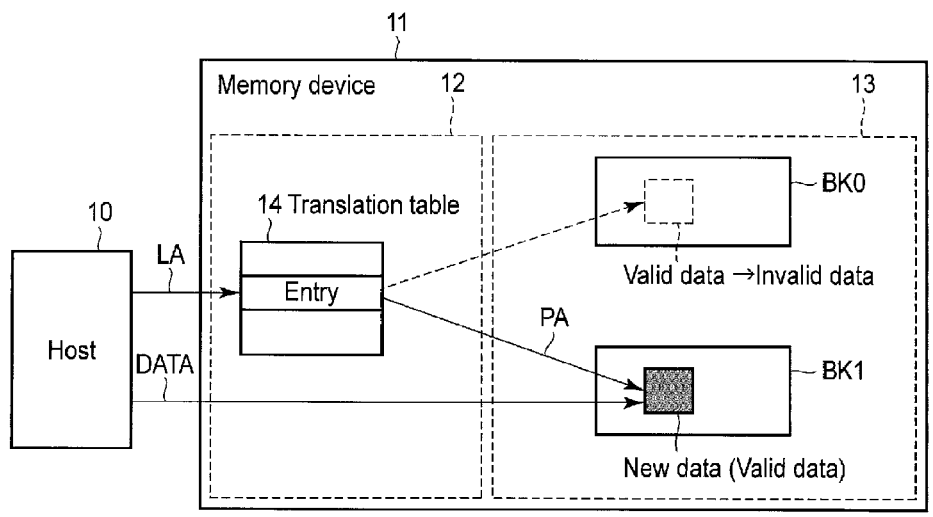
F I G. 4

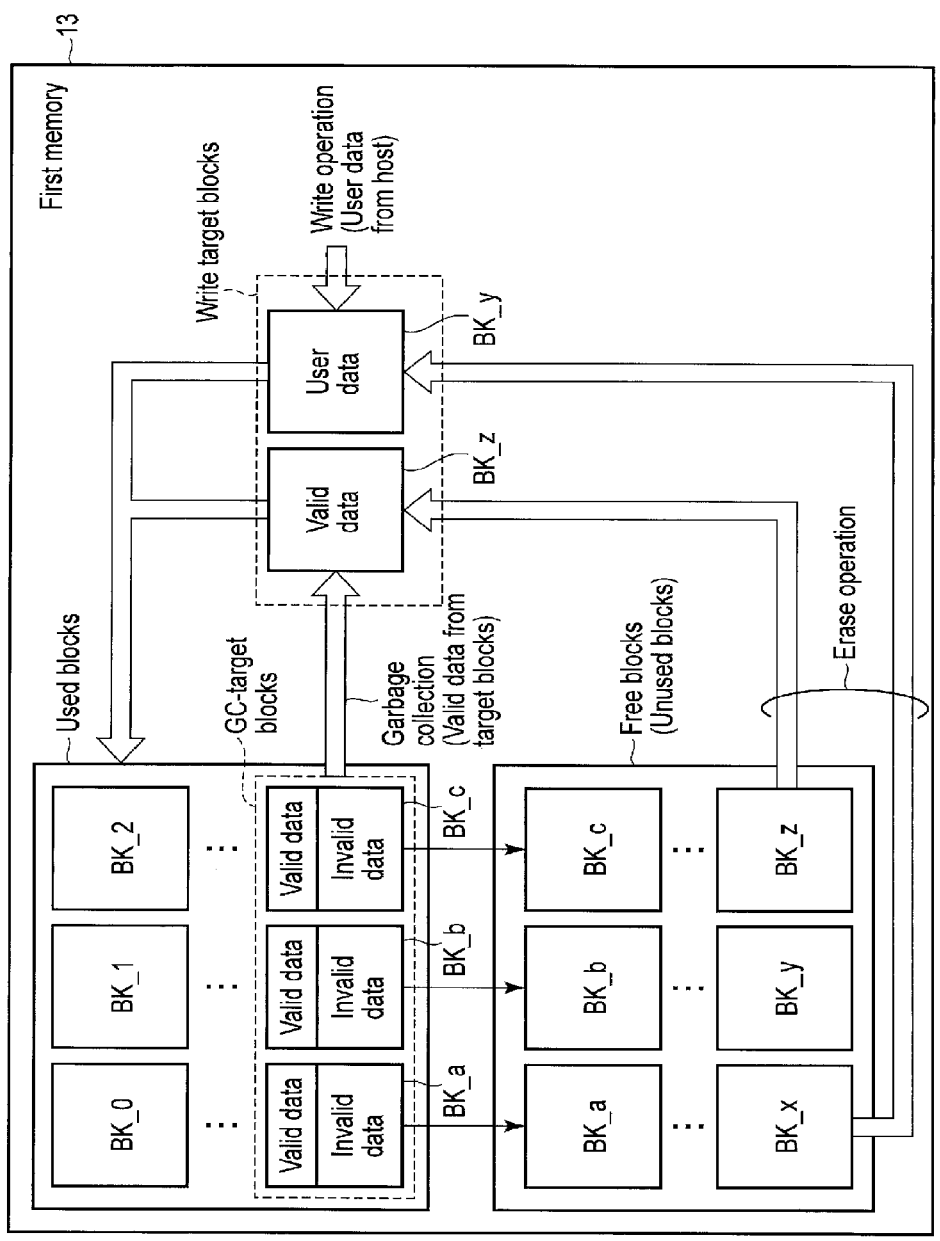
F I G. 6

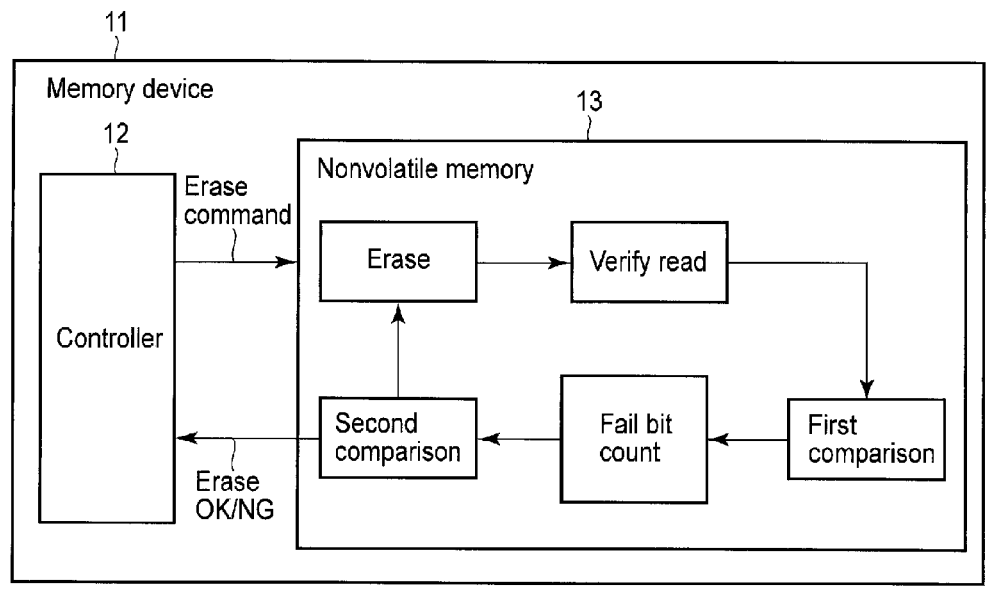
F I G. 7A
| Block information table | | |
|---|---|---|
| Block No. | Number of erase times | Bad block flag |
| BK_0 | N0 | 0 |
| BK_1 | N1 | 0 |
| BK_2 | N2 | 0 |
| ⋮ | ⋮ | ⋮ |
F I G. 7B

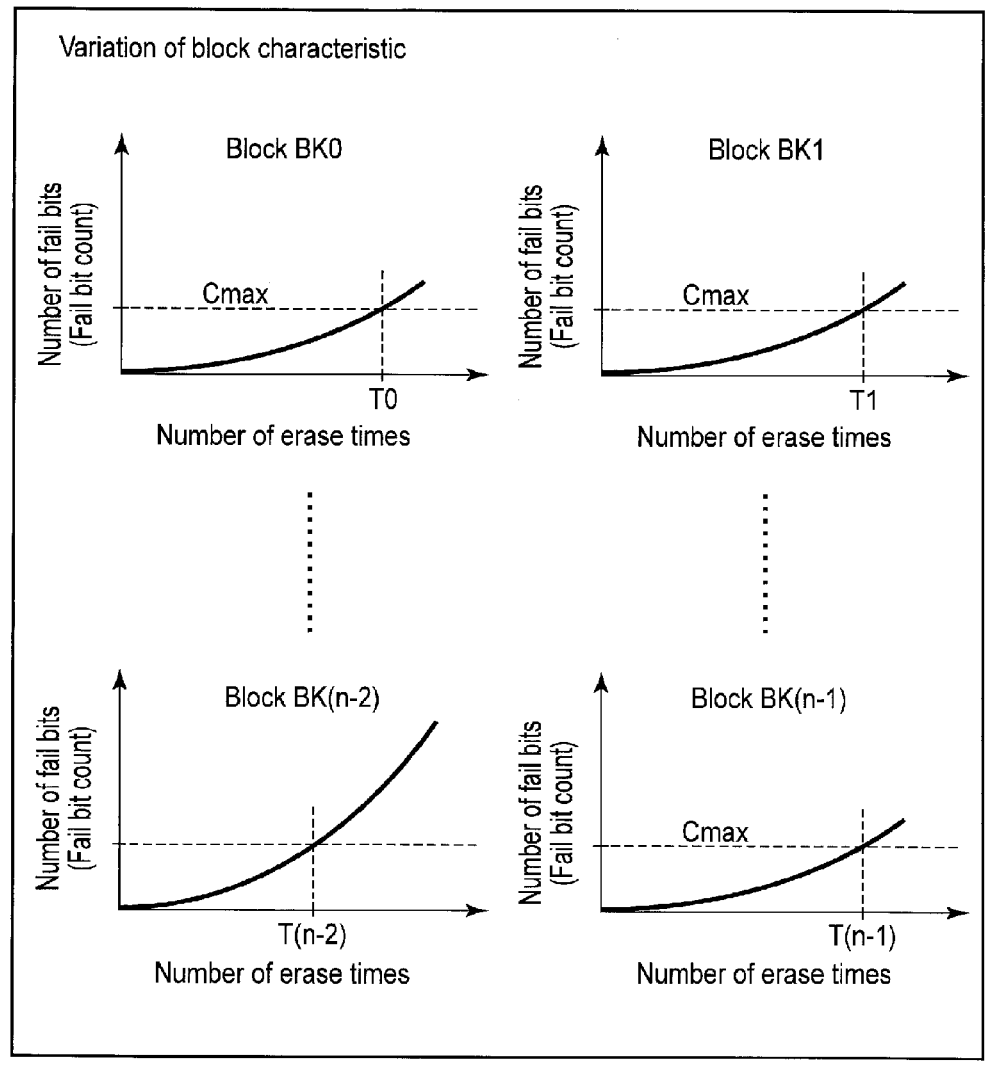
F I G. 8

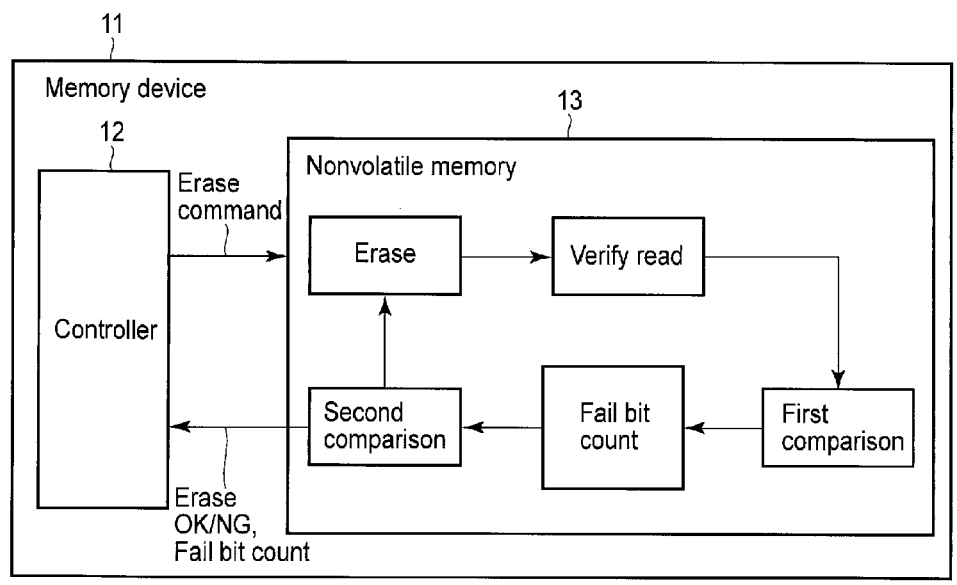
F I G. 10A
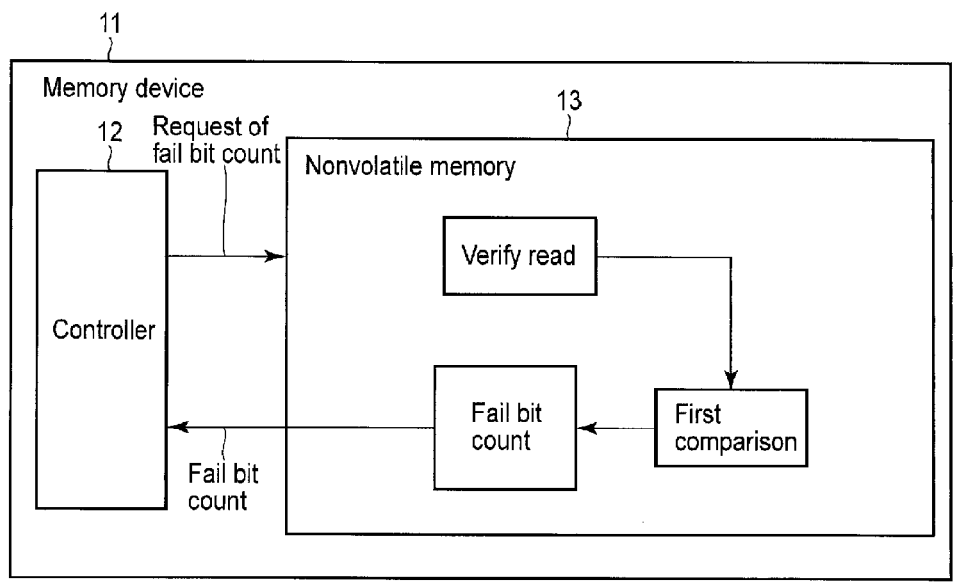
F I G. 12

15

| Block information table | | | |
|---|---|---|---|
| Block No. | Number of erase times | Fail bit count (Number of fail bits) | Bad block flag |
| BK_0 | N0 | FB0 | 0 |
| BK_1 | N1 | FB1 | 0 |
| BK_2 | N2 | FB2 | 0 |
| ⋮ | ⋮ | ⋮ | ⋮ |
| BK_a | Na | FBa | 0 |
| ⋮ | ⋮ | ⋮ | ⋮ |
| BK_b | Nb | FBb | 0 |
| ⋮ | ⋮ | ⋮ | ⋮ |
| BK_c | Nc | FBc | 0 |
| ⋮ | ⋮ | ⋮ | ⋮ |
| BK_x | Nx | FBx | 0 |
| ⋮ | ⋮ | ⋮ | ⋮ |
| BK_y | Ny | FBy | 0 |
| ⋮ | ⋮ | ⋮ | ⋮ |
| BK_z | Nz | FBz | 0 |
| ⋮ | ⋮ | ⋮ | ⋮ |
| BK_(n-1) | N(n-1) | FB(n-1) | 0 |

F I G. 10B

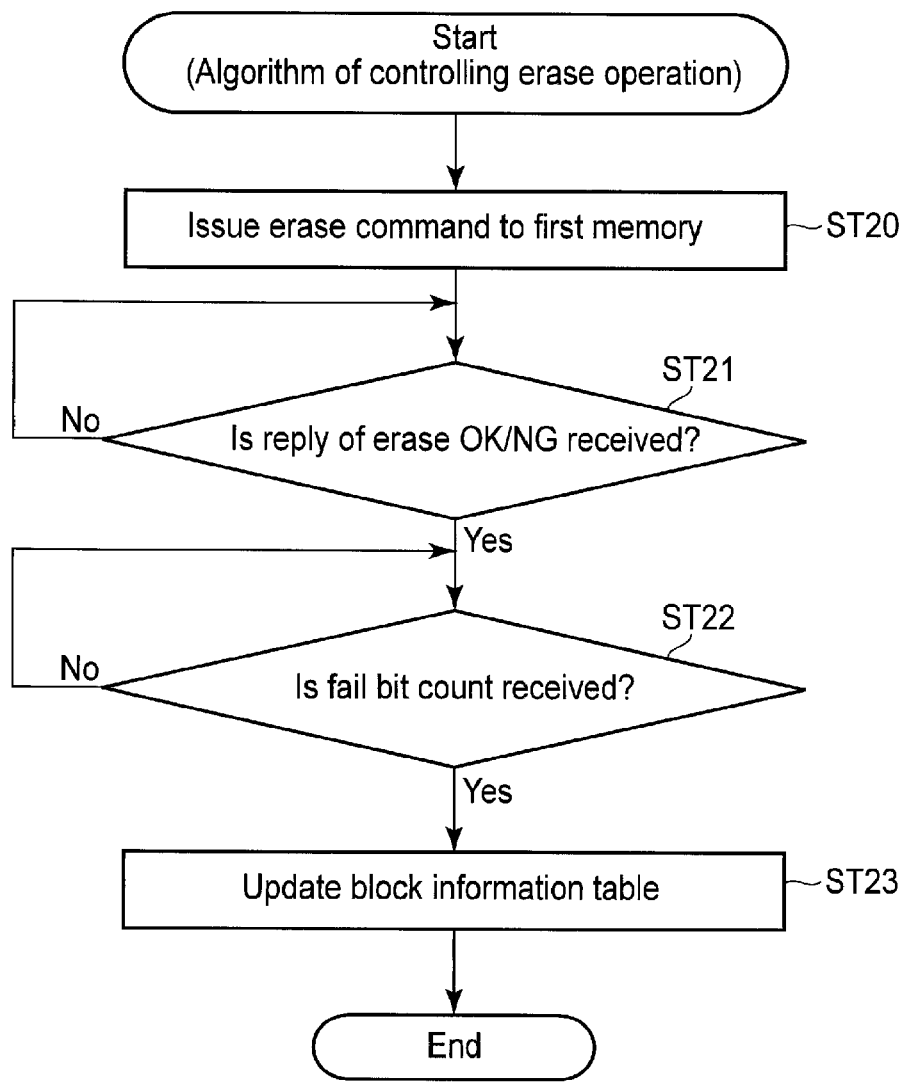
F I G. 14

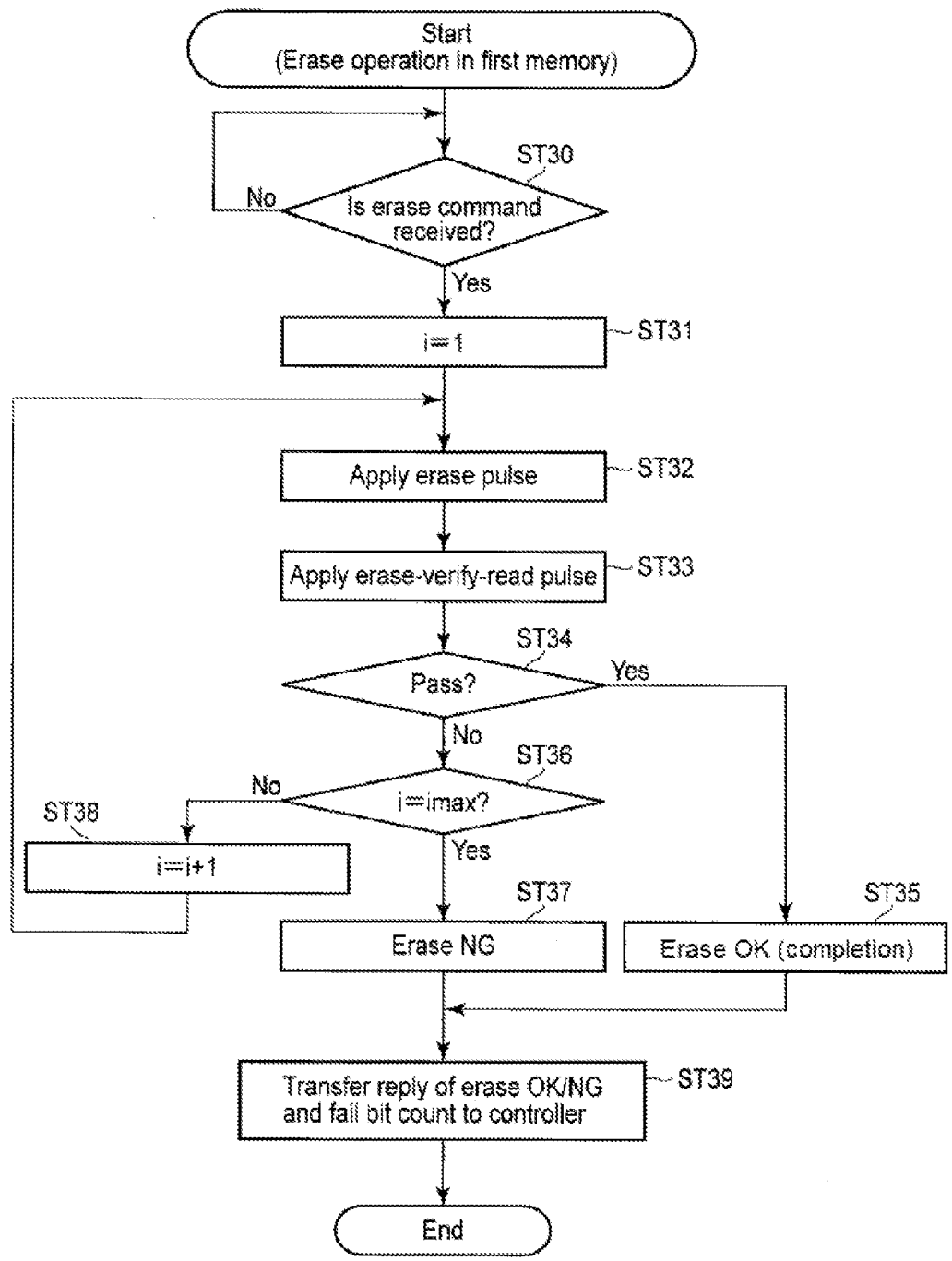
F I G. 15

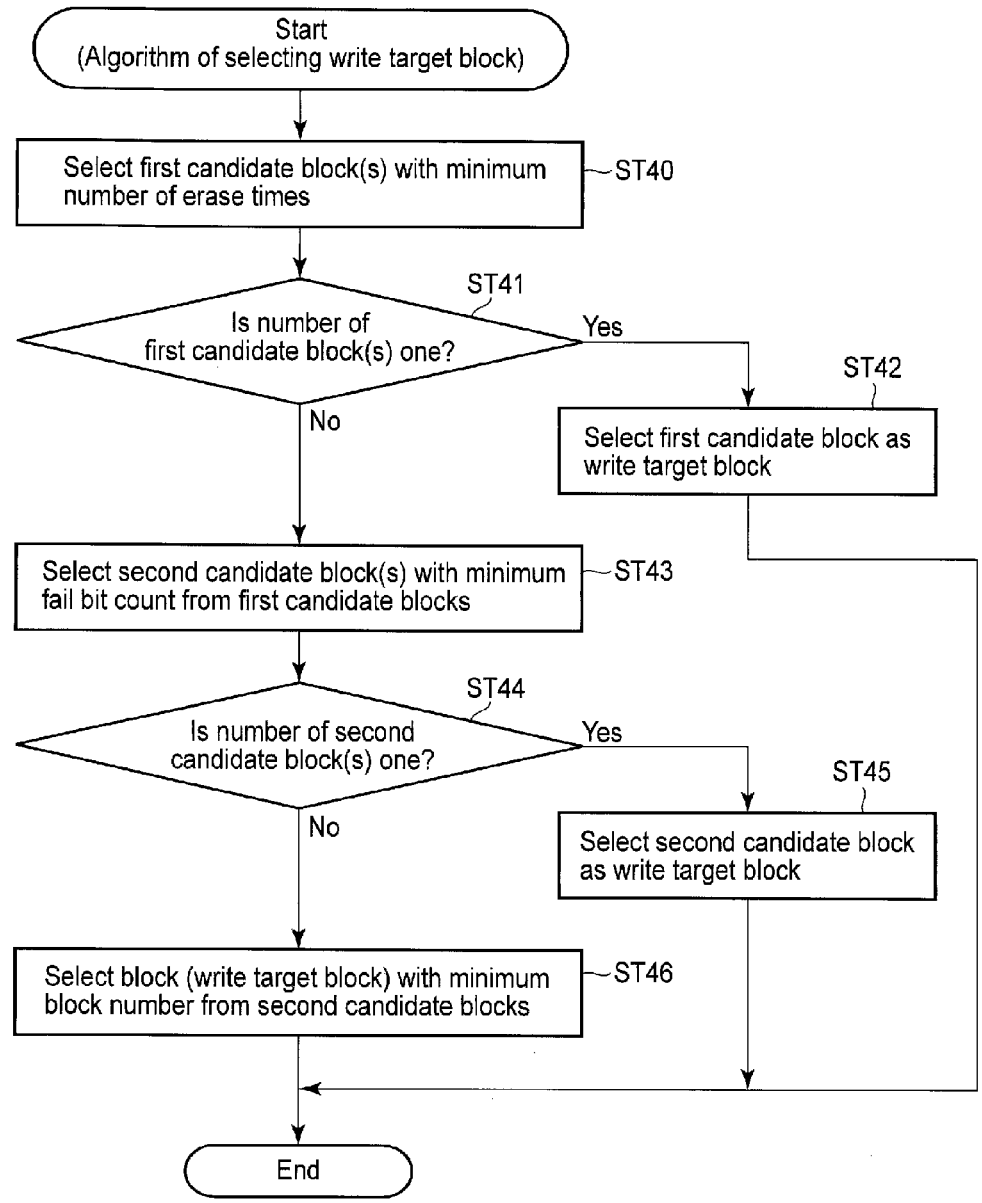
F I G. 16

MEMORY DEVICE THAT EXECUTES AN ERASE OPERATION FOR A NONVOLATILE MEMORY

CROSS-REFERENCE TO RELATED APPLICATIONS

This application claims the benefit of U.S. Provisional Application No. 62/313,325, filed Mar. 25, 2016, the entire contents of which are incorporated herein by reference.

FIELD

Embodiments described herein relate generally to a memory device.

BACKGROUND

A memory device comprises a controller and a nonvolatile memory controlled by the controller. The nonvolatile memory has, for example, a plurality of blocks. Moreover, a data erase operation is executed by the block. A block is identified as a bad block when a count of fail bits, which are included in the block and are failed to be erased even after the erase operation has terminated, exceeds a specified value. Once a block is identified as a bad block, then such a block is no longer used for data writing operation. The count of fail bits generally increases as the erase count (the erase frequency) increases. Therefore, the controller causes an erase operation to be equally executed at a plurality of blocks so as to control wear leveling.

BRIEF DESCRIPTION OF THE DRAWINGS

FIG. 1 is a view illustrating an exemplary memory system.

FIG. 2 is a view illustrating an exemplary nonvolatile memory.

FIG. 3 is a view illustrating an exemplary data structure for the system of FIG. 1.

FIG. 4 is a view exemplarily illustrating how user data is overwritten.

FIG. 5 is a view exemplarily illustrating how garbage collection is executed.

FIG. 6 is a view illustrating a situation in which a block is repeatedly written or erased.

FIG. 7A is a view illustrating a state in which the memory device is brought at the time of erase operation.

FIG. 7B is a view illustrating an exemplary block information table.

FIG. 8 is a view illustrating an exemplary variation of a block characteristic.

FIG. 10A is a view illustrating a state in which the memory device is brought at the time of erase operation.

FIG. 10B is a view illustrating an exemplary block information table.

FIG. 12 is a view illustrating an example of obtaining a fail bit count by verify read.

FIG. 14 is a flowchart which illustrates an exemplary control algorithm which the controller executes at the time of erasure.

FIG. 15 is a flowchart which illustrates an exemplary operation which the first memory executes at the time of erasure.

FIG. 16 is a flowchart which illustrates a first exemplary algorithm for selecting a write target block.

DETAILED DESCRIPTION

Figure 9:
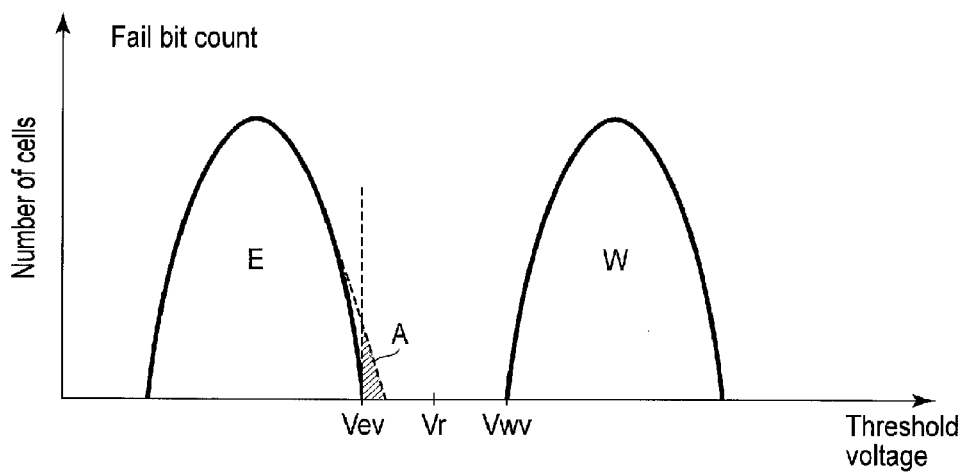
FIG. 9 is a view explaining a fail bit count (the number of fail bits).

In general, according to one embodiment, a memory device comprises: a memory device comprises: a controller; and a nonvolatile memory in which an erase operation is controlled by the controller, the nonvolatile memory including blocks, the erase operation executing every block, the nonvolatile memory transferring a first reply showing a completion of the erase operation and a fail bit count showing a number of memory cells in which a data erase is uncompleted after the completion of the erase operation to the controller. The controller selects a target block as a target of the erase operation based on the fail bit count.

An embodiment will be described hereinafter with reference to the accompanying drawings.

Embodiment

FIG. 1 illustrates an exemplary memory system.

A memory system to which an embodiment may be applicable comprises a host 10 and a memory device 11. The host 10 may be an electronic device such as a personal computer or a mobile device (strictly, a processor in an electronic device). It is also possible that the host 10 may be an imaging device such as a digital still camera or a video camera. Alternatively, it is furthermore possible that the host 10 may be a tablet computer, a smart-phone, a game console, a car navigation system, a printer, a scanner, or a server system.

The memory device 11 is a storage device connectable with the host 10. For example, the memory device 11 may be a solid-state drive (SSD), a flash drive, a memory card, or the like. The memory device 11 comprises a controller 12 and a first memory 13 controlled by the controller 12. The first memory 13 is a nonvolatile memory (for example, a NAND memory). When the first memory 13 is a NAND memory, the NAND memory may comprise memory cells, each having a two-dimensional structure, or may comprise memory cells, each having a three-dimensional structure.

The first memory 13 has a translation table area 13a, a user data area 13b, and a log area 13c, for example. The translation table area 13a holds a translation table. The translation table associates a logical address as an identifier of a piece of user data with a physical address of the user data area 13b where the piece of user data is stored.

The translation table is stored in the translation table area 13a of the first memory 13. The translation table is partly or entirely read from the translation table area 13a in the second memory 12d. The second memory 12d temporarily stores a part of or the whole of the translation table.

The log area 13c holds an erase count, a fail bit count, etc., for example. This will be fully explained later.

The controller 12 controls read/write/erase operation of data to the first memory 13, for example. The controller 12 has a host interface 12a, a memory interface 12b, a write/ erase controller 12c, and a second memory 12d. The write/erase controller 12c controls wear leveling of the first memory 13.

The second memory 12d is, for example, a static random access memory (SRAM), a synchronous dynamic random access memory (SDRAM), or the like. The second memory 12d may be a non-volatile RAM, including a magnetic random access memory (MRAM), a resistive random access memory (ReRAM), a ferroelectric random access memory (FeRAM), or the like. The second memory 12d may be provided outside the controller 12.

The controller 12 may be arranged in a first chip, for example, and the first memory 13 may be arranged in a second chip different from the first chip, for example.

FIG. 2 illustrates an exemplary first memory.

The exemplary first memory 13 is a NAND memory. The first memory 13 comprises an interface circuit 1, a controller 2, a voltage generator 3, a memory cell array 4, a word line decoder/driver 5, and a read/write circuit 6 including sense amplifiers SA.

The interface circuit 1 receives from the controller 12 of FIG. 1, for example, a read/write/erase command CMD and physical address PA. Moreover, the interface circuit 1 functions as an interface for read/write data DATA.

The controller 2 controls read/write/erase operation of the memory cell array 4. For example, when the interface circuit 1 receives an erase command, the controller 2 controls the erase operation of the memory cell array 4. In the erase operation, the controller 2 instructs the voltage generator 3 to generate an erase pulse. The voltage generator 3 generates an erase pulse based on the instructions from the controller 2.

The memory cell array 4 comprises a plurality of blocks (n blocks in the present embodiment) BK0, BK1, . . . , BK(n−1). Each of the blocks comprises a plurality of cell units UT, each connected to a corresponding one of a plurality of bit lines (j bit lines in the present embodiment) BL0, BL1, . . . , BL(j−1).

For example, a cell unit UT in block BK0 comprises a NAND string having serially connected memory cells (i memory cells in the present embodiment) MC0, MC1, . . . , MC(i−1), a selection transistor TS connected between the NAND string and a source line SL, and a selection transistor TD connected between the NAND string and a bit line BLk (k stands for any one of 1 through j−1).

Each of memory cells MC0, MC1, . . . , MC(i−1) is a flash memory cell (a field-effect transistor [FET]) which has a charge storage layer FG, for example, a floating gate, and a control gate electrode CG, for example. Each of the selection transistors TS and TD is an FET which has a gate electrode G, for example.

Memory cells MC0, MC1, . . . , MC(i−1) have their respective control gate electrodes CG which are connected with word lines WL0, WL1, . . . , WL(i−1). The selection transistors TS and TD have their respective control gate electrodes CG which are connected with the selection gate lines SGS and SGD. Each of the bit lines BL0, BL1, . . . , BL(j−1) is connected through a corresponding one of the sense amplifiers SA in the read/write circuit 6 to the interface circuit 1.

The first memory 13 having the above structure executes an erase operation from block to block.

Subsequently, the character of the first memory (for example, a NAND memory) 13 will be explained.

FIG. 3 illustrates an exemplary data structure for the system of FIG. 1.

User data moves from sector to sector between the host 10 and the memory device 11, for example. A cluster is a minimum unit for data address translation executed in the memory device 11, for example. That is, a logical address LA is changed in a physical address PA for every cluster by the translation table 14. A cluster and a sector have the relationship of cluster size≥sector size. Data is stored in a page which is specified by the physical address PA.

A page is a read/write unit for the first memory 13. For example, a page is n times (n is an integer equal to or larger than 1) as large as a cluster. FIG. 3 illustrates a case where a size which is 4 times as large as a cluster size (4K bytes, for example) is a page size. A block is an erase unit for the first memory 13. The data structure of the present embodiment has the relationship of cluster size≤page size<block size.

In this way, a read/write unit and an erase unit are different in size in the first memory 13.

Therefore, as illustrated in FIG. 4, when overwriting data is executed, new data is written in, for example, block BK1 which is different from block BK0 where valid data (a valid cluster) is kept, and the translation table 14 which indicates the relationship between the logical addresses LA and the physical addresses PA is updated. In this case, the new data in block BK1 constitutes valid data (a valid cluster), and the valid data in block BK0 is changed to be invalid data (an invalid cluster).

It is easily conceived that repetition of overwriting with data may increase an invalid data count. Moreover, valid data which the host 10 designates to be erased also changes to invalid data. Invalid data does not function as user data, yet occupies the storage area in the first memory 13. That is, an increase in invalid data means that a storage area which can store user data decreases.

Therefore, invalid data must be erased in order to secure the storage area which can store user data. However, an erase operation in the first memory 13 is executed by the block as mentioned above.

Consequently, for example, garbage collection (copying GC) is executed.

Garbage collection is an operation in which all pieces of valid data held in blocks BK00 and BK01 in the first memory 13 as illustrated in FIG. 5, for example, are first collectively written in (copied to) a single write target block (new block) BK10 in the first memory 13 (compaction), and then are invalidated, thereby making blocks BK00 and BK01 change in free blocks. A free block will be a write target block, to which user data can be written, when invalidated data held in the free block is erased.

It is understood from the above that the write/erase operation is repeatedly executed in the first memory 13 of the memory device 11 under the control of the controller 12.

For example, as illustrated in FIG. 6, garbage collection target blocks BK_a, BK_b, and BK_c, each being a target of garbage collection, are selected from used blocks BK_0, BK_1, BK_2, . . . , BK_a, BK_b, and BK_c, each having at least a piece of valid data. All the pieces of valid data dispersedly kept in garbage collection target blocks BK_a, BK_b, and BK_c are collectively written in (copied to) a single write target block BK_z. Then, garbage collection target blocks BK_a, BK_b, and BK_c will be free blocks, each having at least a piece of invalidated data alone.

Moreover, user data from the host is written in a write target block BK_x in the event of write operation.

A block which satisfies predetermined conditions and is one of unused blocks (free blocks) BK_a, BK_b, BK_c, . . . , BK_x, BK_y, BK_z, each having no valid data, is selected as a candidate block during such garbage collection and write operation. Candidate blocks BK_x and BK_z having been selected in this way will be write target blocks BK_x and BK_z, when their individual invalidated data is erased.

Here, a wear leveling technique is employed for equalizing wear among the memory cells in blocks BK_0, BK_1, BK_2, . . . , BK_a, BK_b, BK_c, . . . , BK_x, BK_y, and BK_z in the first memory 13. A technique of selecting out of free blocks a block having the smallest erase count for a write target block is one example of wear leveling.

In this case, the write/erase operation will not be executed in one block in a concentrated manner. Therefore, occurrence of a bad block will be suppressed and the performance of a memory system will be improved. Namely, a frequent occurrence of a bad block will substantially reduce the memory capacity of the first memory 13. However, since any bad block is hard to occur, decrease in memory capacity will hardly occur to the first memory 13. Accordingly, both garbage collection and write operation will be executed smoothly.

FIG. 7A illustrates a state exhibited by the memory device which is in an erase operation, and FIG. 7B illustrates an exemplary management of the controller for wear leveling.

The controller 12 manages such a block information table as illustrated in FIG. 7B, for example. Erase counts (each being an erase frequency) N0, N1, N2, . . . and bad block flags are recorded in a block information table for every one of blocks BK_0, BK_1, BK_2, . . . . For example, a block which has a bad block flag indicative of 0 is effective, and a block which has a bad block flag indicative of 1 is invalid (a bad block).

The block information table of FIG. 7B is written in, for example, the second memory 12d of the controller 12 in the memory system of FIG. 1.

The controller 12 issues an erase command to the first memory 13, and makes an erase count for a block, which is a target of an erase operation, increase by +1.

Upon receipt of the erase command, the first memory 13 will execute a loop consisting of Erase→Verify read→First comparison→Fail bit count→Second comparison, for example.

Erase is a step of applying an erase pulse to a memory cell in an erase target block. Verify read is a step which follows after erase and reads data from the memory cell in the erase target block. First comparison is a step which verifies whether the data in the memory cell in the erase target block is erased based on the data having been read by the verify read.

Fail bit count is a step of obtaining based on the first comparison a count of fail bits which fail to complete erasure. Second comparison is a step of confirming whether the count of fail bits is larger than a specified value. When the count of fail bits is larger than the specified value, the erase, verify read, first comparison, and fail bit count that have been mentioned above are executed again.

When the fail bit count is (equal to) or smaller than the specified value, the above-mentioned loop consisting of Erase→Verify read→First comparison→Fail bit count→Second comparison will be ended, and a response indicative of erase OK (completion) will be transmitted to the controller 12.

Moreover, when a loop iteration count reaches a maximum number, and when the count of fail bits is larger than the specified value, the above-mentioned loop consisting of Erase→Verify read→First comparison→Fail bit count→ Second comparison is ended, and a response which indicates failure of an erase operation (erase NG) is transmitted to the controller 12.

The controller 12 receives the erase NG response from the first memory 13, and then changes a bad block flag of the block information table of FIG. 7B from 0 to 1.

Whenever the controller 12 executes an erase operation of FIG. 7A, the block information table illustrated in FIG. 7B will be updated, through which the controller 12 will manage wear leveling. For example, the block information table of FIG. 7B makes it possible for the controller 12 to select a free block having the least erase count as a first candidate for a write target block upon selecting a write target block from free blocks as illustrated in FIG. 6.

In this way, the controller 12 causes an erase operation to be equally executed at the blocks, thereby controlling wear leveling.

On the other hand, memory cells for the first memory (a NAND memory, for example) 13 are micronized or are made three-dimensional in recent years, because of which they tend to be largely variable in characteristics even in a wafer process (a production stage). The characteristics include whether electric charge is easily trapped in a tunnel insulating layer, and whether electric charge easily leaks from a charge storage layer (a data retention characteristic).

Therefore, even if one chip (the first memory 13) is taken out of a single wafer, the chip may have blocks (memory cells) which are uneven in characteristics. This means that blocks BK0, BK1, . . . , BK(n–1) in the first memory of FIG. 2 are not necessarily uniform in characteristics.

Let us suppose here that Cmax denotes an upper limit of the number of fail bits (fail bit count), each of which constitutes erase OK. Then, all blocks BK0, BK1, . . . , BK(n–1) in the first memory 13 will be the same in value of Cmax. Therefore, in a case where blocks BK0, BK1, . . . , BK(n–1) are not uniform with one another in characteristics, the maximum values T0, T1, . . . , T(n–2), T(n–1) of the respective erase counts will be different from block to block.

In the example of FIG. 8, block BK(n–2) is the worst in characteristics, and has a least permitted erase count T(n–2).

Under such circumstances, there is a limit to the control of wear leveling which the controller can exert based on the erase count alone. For example, block BK(n–2) may be the smallest in erase count. However, an erase count T(n–2) permitted to block BK(n–2) may be the smallest. Accordingly, it may not be desirable to select block BK(n–2) as a write target block.

Therefore, there is proposed in the following a technique in which a controller administers for every block both an erase count and a fail bit count obtained after an erase operation (erase OK), and controls wear leveling through selecting a write target block from free blocks based on the erase count and the fail bit count.

First of all, a fail bit will be explained.

The fail bit (erase OK) which will be explained below is a memory cell in which erase has not completed even after an erase operation (erase OK).

For example, a memory cell is changed from a write state (W) to an erase state (E) during an erase operation, as apparent from FIG. 9 illustrating the relationship between the threshold voltage and the number of memory cells. If there is a memory cell (see an area A) which has a larger threshold voltage than an erase verify read voltage Vev even after an erase operation (erase OK) has finished, such a memory cell is a fail bit in which erase has not completed.

In addition, Vwv in FIG. 9 denotes a write verify read voltage for verifying whether a write has been completed or not. Moreover, Vr stands for a read voltage for distinguishing between a write state (W) and an erase state (E) at the time of read.

Moreover, in order to simplify the explanation of FIG. 9, a memory cell shall have two values (two levels) for indicating a write state (W) and an erase state (E). However, the memory cell may have three or more values (three or more levels), i.e., many values (many levels). In such a case, what is necessary is just to change one threshold distribution, which a write state (W) has, in a plurality of threshold distributions. Here, all the bits in a target block may be examined and the total number of fail bits may be counted. The upper limit of the number of fail bits may be determined in common among target blocks. Moreover, the number of pages for examining the number of fail bits may be limited for shortening measurement time. For example, the page numbers for measuring a fail bit count may be set as 0, 31, 63, 95, and 127. However, when measuring a fail bit count, it is preferable that the number of pages for examining the number of fail bits may be determined in common among the target blocks.

It is able to calculate the fail bit count in the arbitrary various page number and determine the ware leveling priority with using the calculation results.

For example, the page number 0, 31, 63, 95, 127 or the page number from 0 to 15, with a thin out the various pages may be set. It enables to shorten the tact time and improve the throughput in a mass production phase.

FIG. 10A illustrates the state which the memory device enters an erase operation, and FIG. 10B illustrates an exemplary management which the controller does for wear leveling.

FIG. 10A corresponds to FIG. 7A, and FIG. 10B corresponds to FIG. 7B.

The controller 12 manages a block information table as illustrated in FIG. 10B, for example. FIG. 10A is different from FIG. 7A in that a block information table holds not only erase counts and bad block flags but also the number of fail bits (erase OK).

Namely, the block information table holds for each of blocks BK_0, BK_1, BK_2, . . . , BK_a, BK_b, BK_c, . . . , BK_x, BK_y, BK_z, . . . , BK (n−1) erase counts (erase frequencies) N0, N1, N2, . . . , Na, Nb, Nc, . . . , Nx, Ny Nz, . . . , N(n−1), counts of fail bits (erase OK) FB0, FB1, FB2, . . . , FBa, FBb, FBc, . . . , FBx, FBy FBz, . . . , FB(n−1), and bad block flags.

In the case of the memory system of FIG. 1, the block information table of FIG. 10B is stored in the second memory 12d of the controller 12, for example.

The controller 12 issues an erase command to the first memory 13, and it makes an erase count for a block, which is a target of an erase operation, increase by +1.

Upon receipt of the erase command, the first memory 13 will execute a loop consisting of Erase→Verify read→First comparison→Fail bit count→Second comparison, for example. When a fail bit count is larger than a specified value in a second comparison, the above-mentioned loop consisting of Erase, Verify read, First comparison, and Fail bit count is executed again.

When the fail bit count is equal to or smaller than the specified value, the above-mentioned loop consisting of Erase→Verify read→First comparison→Fail bit count→Second comparison will be ended, and a response indicative of erase OK (completion) and the fail bit count, i.e., the number of fail bits (erase OK), are transmitted to the controller 12.

Moreover, when a loop iteration count reaches a maximum number, and when the count of fail bits is larger than the specified value, the above-mentioned loop consisting of Erase→Verify read→First comparison→Fail bit count→Second comparison is ended, and a response which indicates failure of an erase operation (erase NG) is transmitted to the controller 12.

The controller 12 will change a bad block flag of the block information table of FIG. 10B from 0 to 1 upon receipt of the erase NG response from the first memory 13.

Every time the controller 12 executes an erase operation of FIG. 10A, it updates the block information table illustrated in FIG. 10B, which makes it possible for the controller 12 to manage wear leveling. For example, the block information table of FIG. 10B makes it possible for the controller 12 to select a free block having the least erase count as a first candidate for a write target block upon selecting a write target block from free blocks as illustrated in FIG. 6.

Moreover, when there are two or more free blocks each having the least erase count, the controller 12 selects among the free blocks each having the least erase count a free block having the least number of fail bits (erase OK) as a second candidate for a write target block, for example.

Furthermore, the controller 12 assigns weight to the erase count based on the number of fail bits (erase OK), for example, and selects a free block having the least erase count to which weight is assigned as a write target block.

In addition, a fail bit factor calculated by the equation as a fail bit/erase loop count is used in order to determine the ware leveling priority. Before compare the fail bit count, it is also able to monitor the total erase count in the operation log. It may be determined the ware leveling priority, and it is more reliable in order to compare the fail bit count in the target block. This static control algorithm is generated by the total erase count monitoring sequence and is flexibly used.

Moreover, it is possible for the controller 12 to add the erase count and the number of fail bits (erase OK), and to select a free block having the least sum total as a write target block, for example.

In this way, the controller 12 controls wear leveling based on the erase count and the number of fail bits (erase OK) so that the duration of time while all the blocks in the first memory 13 are effective will be as long as possible. Therefore, occurrence of a bad block is suppressed and the performance of a memory system improves.

Figure 11:
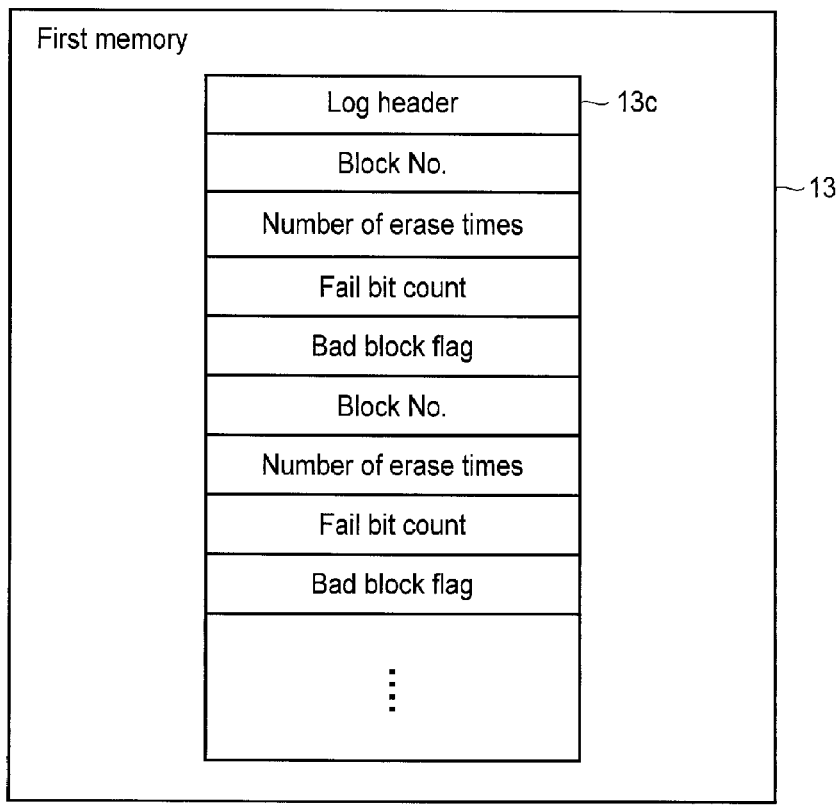
FIG. 11 is a view illustrating an exemplary log area.

FIG. 11 illustrates a log area in the first memory.

As mentioned above, the block information of FIG. 10B is stored in the second memory 12d of the controller 12 in the case of the memory system of FIG. 1. However, when the second memory 12d is a volatile memory, and when a memory system is shut down (is powered off), for example, electricity will be no longer supplied to the memory device 11, and thus the block information table of FIG. 10B will be extinguished.

Consequently, before electricity is no longer supplied to the memory device 11, the controller 12 evacuates the block information table from the second memory 12d to the log area 13c of the first memory (a NAND memory, for example) 13.

The log area 13c holds a history of every block in the user area concerning an erase count, a fail bit count (the number of fail bits [erase OK]) and a bad block flag, for example. That is, the log area 13c has block information (block No., number of erase times, fail bit count, and bad block or not) which follows a log header on which the updating time of the block information table and others are recorded, for example.

Moreover, when electricity is supplied to the memory device 11, the controller 12 reads the block information from the log area 13c of the first memory (a NAND memory, for example) 13, and writes it in the second memory 12d. Then, the controller 12 controls wear leveling based on the block information table held in the second memory 12d.

In the above explanation, all the block information, i.e., the history of each of an erase count, a fail bit count, and a bad block flag, is recorded at every block in the first memory 13. However, in a case where the memory device 11 does not use an algorithm which causes a fail bit count history to be stored in the first memory 13, fail bits may be actually counted block by block in the first memory 13 after electricity has been supplied to the memory device 11.

For example, it is possible as illustrated in FIG. 12 that, after electricity has been supplied to the memory device 11, the controller 12 may instruct the first memory 13 to be subjected to verify read of all the blocks in the first memory 13 using the erase verify read voltage Vev of FIG. 9.

In this case, the first memory 13 receives instructions from the controller 12, executes verify read, and counts the number of fail bits (erase OK) for every block. Moreover, the first memory 13 notifies the controller 12 of the number of fail bits (erase OK) of each block.

In this way, it is possible that an erase count and a bad block flag may be acquired from the first memory 13, and that a fail bit count may be obtained by actually counting the number of fail bits for every block in the first memory 13 after electricity is supplied to the memory device 11.

Figure 13:
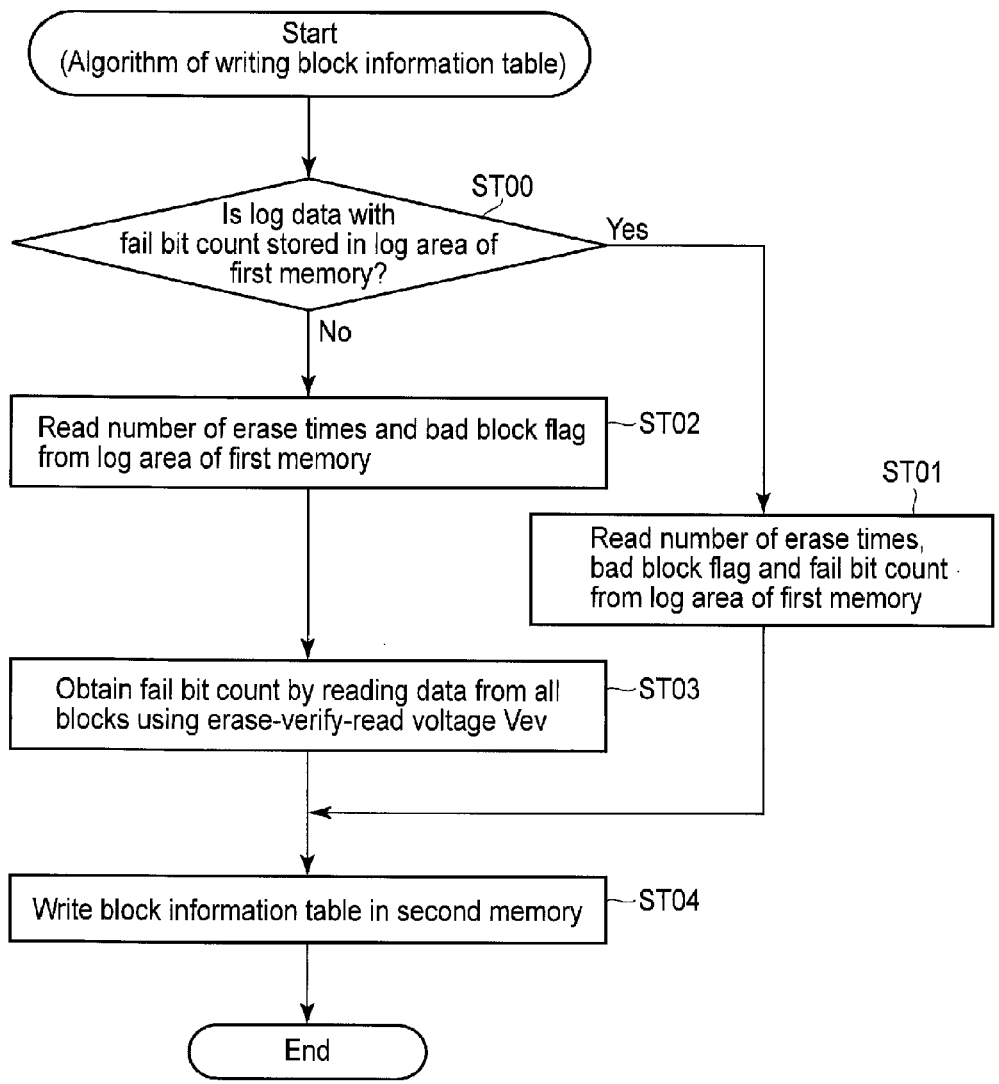
FIG. 13 is a flowchart which illustrates an exemplary algorithm which prepares block information.

FIG. 13 illustrates an exemplary algorithm for preparing a block information table.

The algorithm of FIG. 13 is executed by the write/erase controller 12c of FIG. 1, for example.

First of all, the controller 12c confirms whether a fail bit count (the number of fail bits [erase OK]) is recorded in the log area 13c of the first memory 13 (step ST00). Let us suppose here that those constituents of the block information except for fail bit counts, i.e., erase counts and bad block flags are also recorded in the log area 13c of the first memory 13.

When the fail bit counts (each being the number of fail bits [erase OK]) are recorded in the log area 13c of the first memory 13, the controller 12c acquires erase counts, fail bit counts, and bad block flags from the log area 13c of the first memory 13 (step ST01).

On the other hand, when fail bit counts are not recorded in the log area 13c of the first memory 13, the controller 12c acquires erase counts and bad block flags from the log area 13c of the first memory 13 (step ST02). Moreover, the controller 12c reads data from each block in the first memory 13 using the erase verify read voltage Vev, and acquires fail bit counts from the respective blocks (step ST03).

The controller 12c prepares a block information table based on the erase counts, fail bit counts and bad block flags, all having been obtained through steps ST01 to ST03, and writes the table in the second memory 12d.

FIG. 14 illustrates an exemplary control algorithm which the controller executes at the time of an erase operation.

The algorithm of FIG. 14 may be executed by the write/erase controller 12c of FIG. 1, for example.

The controller 12c first issues an erase command to the first memory 13 (step ST20). When the controller 12c successively receives from the first memory 13 an erase OK/NG response (step ST21) and a fail bit count (step ST22), the controller 12c will update the block information table (step ST23).

That is, the controller 12c makes the erase count of the erase target block increase +1, and updates the fail bit count. On the other hand, if the controller 12c receives from the first memory 13 a response which indicates failure of an erase operation (erase NG), the controller 12c will change the bad block flag from 0 to 1.

FIG. 15 illustrates an exemplary operation algorithm which the first memory executes at the time of erase operation.

The algorithm of FIG. 15 may be executed by the controller 2 of FIG. 2, for example.

The controller 2 first checks whether an erase command has been received. Upon confirmation of receipt of an erase command, the controller 2 sets i to 1. The controller 2 applies to an erase target block an erase pulse for executing once an erase step consisting of the loop ($i^{th}$ loop) (steps ST30, ST31, ST32).

Subsequently, the controller 2 applies to the erase target block an erase verify read pulse for executing once a verify step consisting of the loop ($i^{th}$ loop) (step ST33).

Subsequently, the controller 2 determines whether erasure of data from the erase target block has been completed or not based on the data having been read from the erase target block at the verify step.

When the controller 2 determines that the erasure of data has been completed (Pass), the controller 2 transmits an erase OK (completion) reply to the controller 12 (steps ST34, ST35, ST39).

When the controller 2 determines that the erasure of data has not been completed yet, the controller 2 confirms whether i (the number of repetitions) has reached the maximum imax. When i is imax, the controller 2 transmits to the controller 12 a reply which indicates that the erasure of data from the erase target block is NG, i.e., a reply which indicates that the block is a bad block (steps ST34, ST36, ST37, ST39).

On the other hand, when i is less than imax, the controller 2 sets i+1 as new i (steps ST36, ST38). And the controller 2 successively subjects the erase target block to an erase step and a verify step, each consisting of the loop ($i+1^{th}$ loop), similarly to what has been just mentioned above (steps ST32, ST33).

The loop will be repeated until erasure of data from the erase target block will be indicated as OK or (step ST35) NG (step ST37).

FIG. 16 illustrates a first exemplary algorithm for selecting a write target block.

The algorithm of FIG. 16 may be executed by the write/erase controller 12c of FIG. 1, for example.

In the first example, at least one candidate block is selected for a first candidate based on erase counts. When two or more first candidate blocks are selected, a second candidate block is selected from the selected first candidate blocks for a second candidate based on fail bit counts.

The controller 12c first selects from free blocks of FIG. 6 at least one block, which has the smallest erase count, for a first candidate block, for example (step ST40). When only a single first candidate block has been selected for a first candidate, the controller 12c selects the single first candidate block as a write target block (steps ST41, ST42).

In contrast, when two or more first candidate blocks are selected, the controller 12c selects from the selected first candidate blocks at least one block, which has the smallest fail bit count, for a second candidate block (step ST43).

When only a single second candidate block has been selected for a second candidate, the controller 12c selects the single second candidate block as a write target block (steps ST44, ST45).

Figure 17:
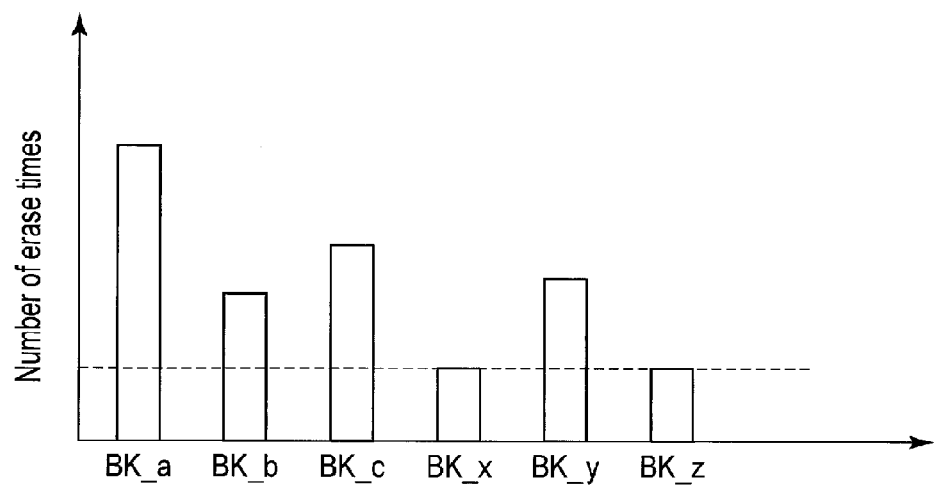
FIG. 17 is a view illustrating an exemplary erase count of each block.
Figure 18:
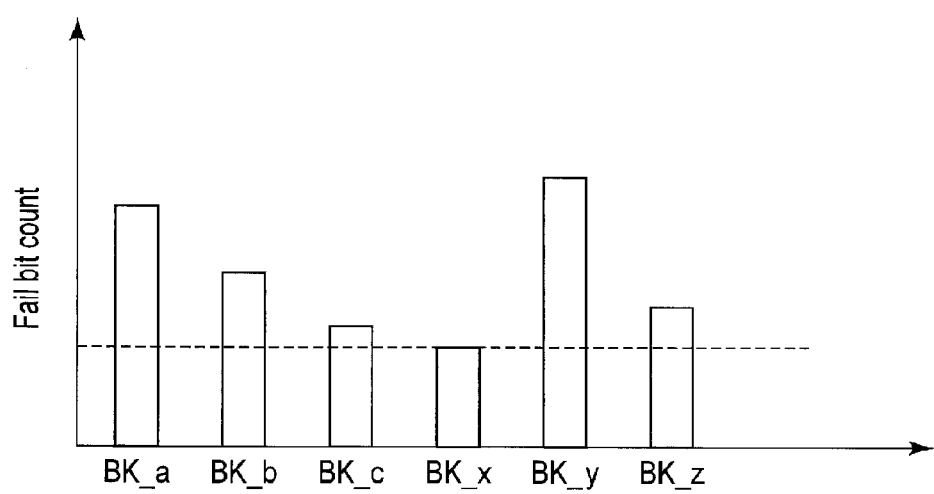
FIG. 18 is a view illustrating an exemplary fail bit count of each block.

For example, when erase counts have a relationship illustrated in FIG. 17, and when fail bit counts have a relationship illustrated in FIG. 18, the controller 12c selects two blocks BK_x and BK_z for a first candidate block, and selects block BK_x for a second candidate block. In this case, the controller 12c selects block BK_x for a write target block.

When there are two or more second candidate blocks that have been selected, the controller 12c selects from the second candidate blocks a block having a smallest block number for a write target block (step ST46). It should be noted here that a block having a smallest block number is set to a target for convenience sake. However, when blocks that are different from one another in physical position are combined together, it is possible to arbitrarily select a target block.

Figure 19:
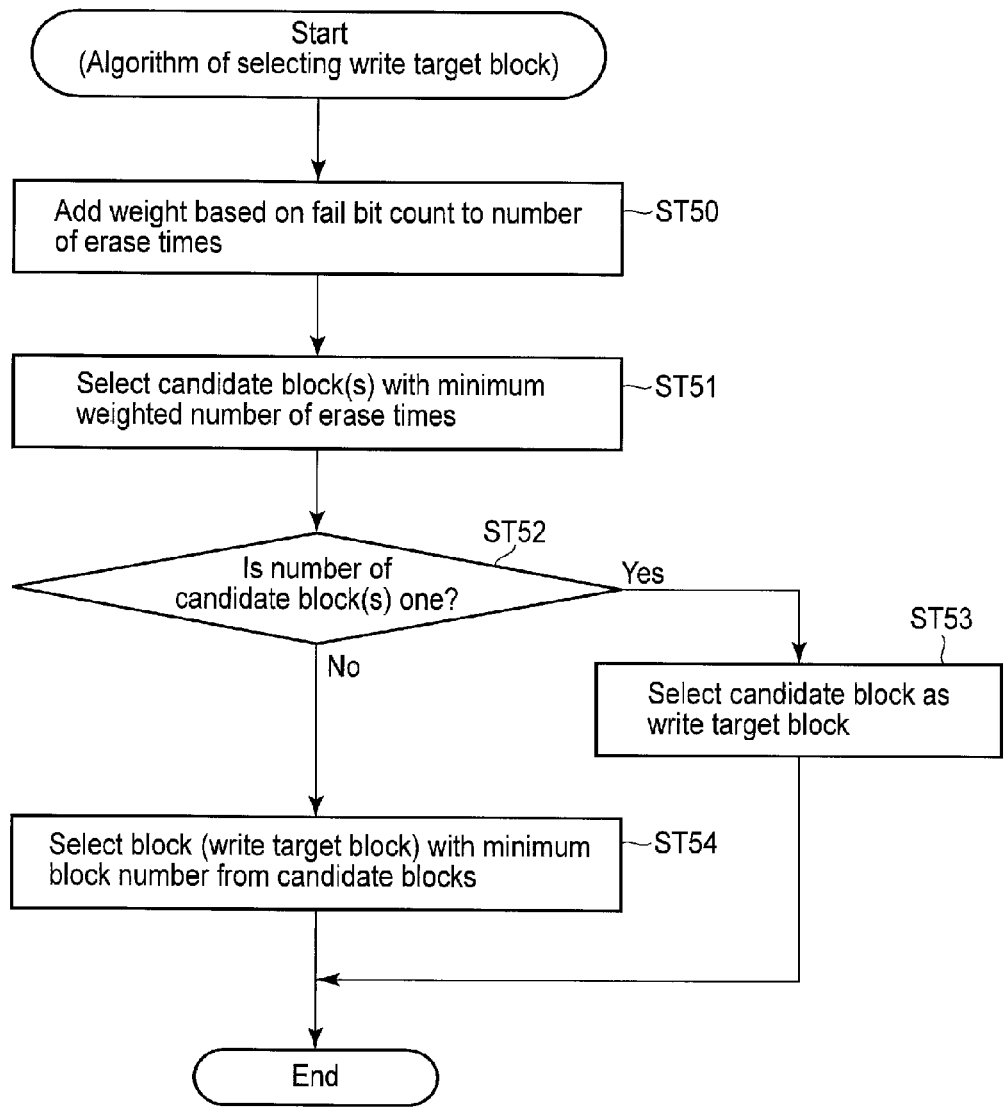
FIG. 19 is a flowchart which illustrates a second exemplary algorithm for selecting a write target block.

FIG. 19 illustrates a second exemplary algorithm for selecting a write target block.

The algorithm of FIG. 19 may be executed by the write/erase controller 12c of FIG. 1, for example.

In the second example, weights are assigned to erase counts based on fail bit counts, and at least one candidate block is selected based on the erase counts to which weights are assigned.

The controller 12c first assigns a weight to an erase count based on a fail bit count (step ST50).

For example, when an erase count is n1, and when a fail bit (erase OK) count is n2, the erase count NE to which a weight is assigned may be set to (n1+n2). It is also possible to set the erase count NE to (n1+α×n2). In this case, if the value of α is increased, the influence of a fail bit (erase OK) count will be intensified, and if the value of α is decreased, the influence of a fail bit (erase OK) count will be weakened.

At least one block which is the smallest in weighted erase count is selected for a candidate block from the free blocks of FIG. 6 (Step ST51). When only a single candidate block has been selected, the controller 12c selects the single candidate block for a write target block (steps ST52, ST53).

When there are two or more candidate blocks that have been selected, the controller 12c selects from the selected candidate blocks a block, which is the smallest in block number or fail bit count, for a write target block (steps ST52, ST53).

(Others)

In the present embodiment, the control which the controller 12 (or the write/erase controller 12c) of FIG. 1 executes may be executed by hardware, or by software, or the combination of hardware and software. Whether the algorithms illustrated in FIG. 13, FIG. 14, FIG. 16, and FIG. 19 are implemented by hardware, or software, or their combination is dependent on an environment where a memory system is applied, and the design restrictions imposed on the memory system.

Those skilled in the art can variously achieve the control executed by the controller 12 of FIG. 1 based on the above mentioned illustrative embodiments. Therefore, such achievements are all included in the category of the present invention.

CONCLUSION

As has been explained above, the embodiment makes it possible to control wear leveling based on erase counts and fail bit counts. Accordingly, even if variation in characteristics occurs in a plurality of blocks in a first memory (for example, a NAND memory), the blocks are correctly controlled in wear leveling. Accordingly, occurrence of a bad block will be suppressed, and a memory system will be improved in performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a controller; and
    a nonvolatile memory in which an erase operation is controlled by the controller, the nonvolatile memory including blocks, each of the blocks being a unit for the erase operation, the nonvolatile memory transferring a first reply showing a completion of the erase operation and first information based on a number of memory cells in which a data erase is uncompleted after the completion of the erase operation to the controller.

2. The memory device of claim 1, wherein the controller selects a target block as a target of the erase operation based on the first information.

3. The memory device of claim 2, wherein the controller manages a number of erase times and the first information for each of the blocks.

4. The memory device of claim 3, wherein the controller selects first candidate block(s) in which the number of erase times is smallest, and selects the first candidate block as the target block when a number of the first candidate block(s) is one.

5. The memory device of claim 4, wherein
    the first information includes a fail bit count showing the number of memory cells in which the data erase is uncompleted after the completion of the erase operation, and
    the controller selects second candidate block(s) in which the fail bit count is smallest from the first candidate blocks when the number of the first candidate block(s) is two or more, and selects the second candidate block as the target block when a number of the second candidate block(s) is one.

6. The memory device of claim 5, wherein the controller selects a final block from the second candidate blocks when the number of the second candidate block(s) is two or more, and selects the final block as the target block.

7. The memory device of claim 3, wherein the controller associates a weight based on the first information with the number of erase times, selects candidate block(s) in which a weighted number of erase times is smallest, and selects the candidate block as the target block when a number of the candidate block(s) is one.

8. The memory device of claim 7, wherein the controller selects a final block from the candidate blocks when the number of the candidate block(s) is two or more, and selects the final block as the target block.

9. The memory device of claim 1, wherein the number of erase times and the first information are stored in a volatile memory in the controller.

10. The memory device of claim 9, wherein the controller evacuates the number of erase times and the first information from the volatile memory to the nonvolatile memory before power supplied to the memory device is turned off.

11. The memory device of claim 9, wherein the controller reads the number of erase times and the first information from the nonvolatile memory to the volatile memory after power supplied to the memory device is turned on.

12. The memory device of claim 9, wherein the controller obtains the first information by executing an erase-verify-read operation for each of the blocks after power supplied to the memory device is turned on.

13. The memory device of claim 2, wherein the controller selects the target block from free blocks with no valid data.

14. The memory device of claim 13, wherein the controller executes a write operation which writes data to the target block after the erase operation.

15. The memory device of claim 1, wherein
the first information includes a fail bit count showing the number of memory cells in which the data erase is uncompleted after the completion of the erase operation, and
the nonvolatile memory transfers a second reply, the second reply being the first reply showing a failure of the erase operation, to the controller when the fail bit count is larger than the predetermined value.

16. The memory device of claim 15, wherein the controller manages a block associated with the second reply as a bad block when receiving the second reply.

17. The memory device of claim 1, wherein the controller is provided in a first chip, and the nonvolatile memory is provided in a second chip different from the first chip.

18. The memory device of claim 1, wherein the memory device is a solid state drive (SSD).

19. A nonvolatile memory in which an erase operation is controlled by a first controller, the nonvolatile memory comprising:
blocks, each of the blocks being a unit for the erase operation; and
a second controller transferring a reply showing a completion of the erase operation and first information based on a number of memory cells in which a data erase is uncompleted after the completion of the erase operation to the first controller.

20. The nonvolatile memory of claim 19, wherein the first information includes a fail bit count showing the number of memory cells in which the data erase is uncompleted after the completion of the erase operation.

* * * * *